United States Patent [19]

Seio et al.

[11] Patent Number: 5,474,666
[45] Date of Patent: Dec. 12, 1995

[54] METHOD OF TREATING AN ELECTRODEPOSITED PHOTOSENSITIVE RESIST TO REDUCE WATER SPOTTING

[75] Inventors: Mamoru Seio, Takatsuki; Kazuyuki Suga, Sakai; Kanji Nishijima, Ibaraki, all of Japan

[73] Assignee: Nippon Paint Co., Ltd., Osaka, Japan

[21] Appl. No.: 156,722

[22] Filed: Nov. 24, 1993

[30] Foreign Application Priority Data

Nov. 25, 1992 [JP] Japan ..................................... 4-314801

[51] Int. Cl.⁶ .............................. C25D 5/48; C25D 13/06
[52] U.S. Cl. .................... 204/180.2; 204/180.6; 205/125; 205/229; 205/920
[58] Field of Search ..................... 205/125, 126, 205/229, 918, 920; 204/180.2, 181.4, 181.6, 181.7, 180.6

[56] References Cited

U.S. PATENT DOCUMENTS

| | | | |
|---|---|---|---|
| 3,985,722 | 10/1976 | Yoshida et al. | 530/360 |
| 4,732,690 | 3/1988 | Shaw | 252/8.554 |
| 4,832,950 | 5/1989 | Takaya et al. | 424/81 |
| 4,898,656 | 2/1990 | Hoshino et al. | 204/181.1 |

FOREIGN PATENT DOCUMENTS

| | | |
|---|---|---|
| 0383223 | 8/1990 | European Pat. Off. . |
| 0469537 | 2/1992 | European Pat. Off. . |
| 2-39050 | 2/1990 | Japan . |
| WO91/08840 | 6/1991 | WIPO . |

OTHER PUBLICATIONS

F. A. Lowenheim, *Electroplating*, McGraw–Hill Book Co., New York, 1978, pp. 99–105.

*Primary Examiner*—John Niebling
*Assistant Examiner*—William T. Leader
*Attorney, Agent, or Firm*—Wenderoth, Lind & Ponack

[57] ABSTRACT

Water spotting which occurs during rinsing of an electrodeposited photosensitive resist composition on a copper layer of a printed circuit board is reduced by applying an aqueous solution containing a surfactant. The surfactant is preferably a salt of an acylated polypeptide which is solid at ambient room temperature and forms a thin uniform film when the solution is dried.

2 Claims, No Drawings

METHOD OF TREATING AN ELECTRODEPOSITED PHOTOSENSITIVE RESIST TO REDUCE WATER SPOTTING

FIELD OF THE INVENTION

The present invention relates to an improvement of a process for forming a resist layer on a plate for an electric circuit board by electrodeposition. In particularly, it relates to a process for surface treatment of a resin film immediately after electrodeposition.

BACKGROUND OF THE INVENTION

In recent years, with progress of reduction in size and weight and increase of functions and processing speed of electronic apparatus, the reduction in size, increase of integration and dissemination of surface mounting technology of various electronic parts have advanced and a demand for higher integration and higher reliability of printed circuit boards has increased.

For producing printed circuit boards, it has been proposed that a resist composition is printed on a substrate having copper surface to form a patterned resist layer as etching protective layer, and then etching is conducted to obtain a patterned copper circuit board. It has also been proposed that, instead of printing the resist composition, the resist composition is coated on the substrate having copper surface and then exposed to light and developed to form a patterned resist layer. The coating can be conducted by electrocoating.

Electrocoating is a method wherein a substrate is dipped in an electrodeposition bath which contains a water soluble or water dispersible photosensitive resin composition, and an electric current is applied as giving an opposite charge to a substrate to be electrocoated to form the photosensitive resin composition layer on the substrate. Electrodeposition coating has such advantages that it is possible to form a film with uniform thickness on the copper surface of the substrate, to enable easy control of film thickness by adjusting applied voltage and applied period of time, to obtain good follow-up of the film to the indentation of and injury of the copper surface which makes special pretreatment of the copper surface of the substrate unnecessary, etc. Even when small diameter through-holes or via-holes exist in the substrate, the electrocoating composition infiltrates into such holes to form the photosensitive resin layer which becomes a sufficient protective film against the etching liquid. Besides, automation of the process is easy and through processing line from plating up to the step before the light exposure can be established.

However, in the electrodeposition coating, the film immediately after electrodeposition is wetted by residual moisture, solvent and undeposited coating liquid. Consequently, it is general to rinse the film with ion exchanged water to remove the undeposited coating liquid and subsequently to heat-dry to remove the moisture and water.

However, if water rinsing or dewatering after water rinsing is insufficient, water drop marks or unremoved coating liquid marks remain on the electrodeposited film. Especially in the case of positive type electrodeposition resist film, the marks remain without being removed by developing or etching even when the part in question has been exposed to light, and they become the cause of shorting between wirings. Also, around the circular periphery of water drop marks, pinholes often generate.

These troubles cause fatal damage to the manufacture of highly integrated printed circuit boards since the conductor pattern of the board has become finer and finer recently. Thus, in the actual industrial producing line, number of water rinsing steps increases, but it is not sufficient in view of a space for equipments. In order to prevent the water drop marks, air-blowing after washing has been proposed but depending on an angle and position of an air-blower, a size or shape of the substrate or due to spreading of water drops caused by a complicated shape of jigs fixing the substrate during transportation, water drop marks may easily remain on the film. It is therefore highly difficult to completely prevent generation of the water drop marks.

In order to avoid the above mentioned water drop marks, Japanese Kokai Publication 2(1990)-39050 discloses a method wherein a conventional electrocoating composition is electrocoated on a substrate, and then a different electrocoating composition composed of watersoluble or waterdispersible resin as a main polymer is further electrocoated. This method is effective in preventing generation of water drop marks, but since it necessitates the additional installation of electrodeposition equipment, installation cost of the system is high and incorporation of the equipment into the existing electrodeposition line accompanies the problem of modification of installation space and operation program.

SUMMARY OF THE INVENTION

The objective of the present invention is to provide the method of surface treatment of an electrocoated film wherein water drop marks and unremoved coating liquid marks, etc. are not produced on the electrodeposition film and generation of defects on the fine printed pattern is inhibited. Accordingly, the present invention provides a process for surface treating an electrodeposition type photosensitive resin film, comprising electrocoating a photosensitive resin composition on a copper plate for a printed circuit board to form a resist layer, characterized by that an aqueous solution containing a surfactant is applied on the electrodeposited film and then dried.

DETAILED DESCRIPTION OF THE INVENTION

The term "surfactant" mentioned in the present invention is a substance which has both a hydrophilic part and a hydrophobic part in one molecule, indicates surface activity at a surface of a solution and forms micelle colloids when a concentration is higher than critical micelle concentration. The aqueous solution containing the surfactant exhibits wetting or osmotic function because of reduction of surface tension, and wets and spreads over the surface of the deposited film. That is, due to the treatment of the surface of the electrocoated film by an aqueous solution containing an appropriate surfactant, water remaining at the surface of the film does not remain in the form of water drop but uniformly spreads over and wets the film surface and consequently does not leave any water drop marks after the subsequent drying step. The purifying effect of the surfactant also improves water rinsing efficiency and inhibits generation of unremoved coating liquid marks even when the number of steps of water rinsing is few.

Furthermore, even when unremoved coating liquid marks are produced, the surfactant layer remains on the surface of the deposited film after drying and prevents inferior of development. Thereby the original photosensitivity and developing property are maintained all over the film and occurrence of inferior development is inhibited.

The surfactant to be used in the present invention can be anyone which is known to the art, but taking it into consideration that a surfactant layer is formed on the electrocoated film, it is preferred that the surfactant is solid at room temperature. When liquid surfactant is used, the liquid component remains on the dried film and in some cases, the surface exhibits sticky characteristics and stains circuit pattern film in the exposing step.

The surfactant which is in solid state at room temperature may preferably be an organic or inorganic alkali salt of acylated polypeptide. The acylated polypeptide mentioned here are protein materials (e.g. collagen, keratin, fibron, elastin, etc.) which are acylated by fatty acid, as described in P.69 and P.85 of "Surfactants with Special Function" (edited under the supervision of Takao Kariyone, CMC Co., 1986). Generally acylation may be conducted easily by the well-known method using acid chloride, acid anhydride or cyclic anhydride. Acylation materials preferably used for the invention are palm oil fatty acid, lauric acid, myristic acid, stearic acid, oleic acid, undecylenic acid, isostearic acid, resin acid, behenic acid, erucic acid, phthalic anhydride, succinic anhydride, maleic anhydride, itaconic anhydride, etc. The protein materials to be acylated generally are those which are hydrolyzed by acid, alkali or various kinds of protein decomposing enzyme to reduce average molecular weight to the range of about 200 to 2,000. Among them, a hydrolyzed collagen which is acylated by palm oil fatty acid is particularly preferred. These materials are solid in normal state, have film forming property and they easily form thin uniform film when their aqueous solution is dried by heating. Also, by selecting appropriate coating time and time from coating until drying, it is possible to inhibit excessive infiltration into the inside of the deposited film and inhibit the influence on the characteristics indigenous to the film itself.

The organic or inorganic alkali salt of these compounds is preferably derived from sodium, potassium, ammonium, 2-amino-2-methyl-1-propanol, 2-amino-2-methyl-1,3-propanediol, monoethanolamine, diethanolamine, triethanolamine, morphorine, isopropanolamine, alginin, lysine, etc., which forms counter-ion.

The organic or inorganic alkali salt of acylated polypeptide may be dispersed or dissolved in ion exchanged water at the concentration of 0.005 to 50 wt % to obtain an aqueous solution. The aqueous solution is coated as final rinsing solution on the electrocoated film by dipping or spraying and thus the solution uniformly spreads over and wets the surface. The surface is uniformly dewatered by subsequent air-blowing and thus even after the subsequent heat-drying, water drop marks do not remain on the film. At this time, the surfactant remains on the surface of the film even after air-blowing and prevents formation of water dews in the subsequent step. When the solution is used at the concentration less than 0.005 wt %, surface activation efficiency is low and rinsing water remains in water drops on the deposited film after air-blowing and water drops do not sufficiently spread over and wet the film surface and water drop marks remain after drying. When the concentration is over 50 wt %, viscosity is too high and coating amount remarkably increases when the solution is coated by spraying or dipping and produces such problems as inferior dewatering, sagging, inferior drying, etc.

The aqueous solution, if necessary, may contain antiseptics for prevention of fouling, organic solvent for adjustment of drying property, defoaming agent or water-soluble or water dispersible resin for adjustment of coating property.

The electrodepositable photosensitive resin used for the present invention may be either negative type or positive type. The negative type composition is usually composed of a binder resin having ionic group, polymerizable polyfunctional monomers, a photopolymerization initiator and a thermopolymerization inhibitor. The binder resin may be an acrylic resin having acid groups (e.g. carboxylic groups) or a basic group (e.g. amino groups), a vinyl resin modified with maleic acid, a diene copolymer added with carboxylic anhydride, a high acid value alkyd resin modified with an unsaturated fatty acid, an unsaturated fatty acid ester of epoxy resin, etc. Also used with preference are such resins as having been given photocuring properties by the method to add unsaturated compounds containing glycidyl groups to a part of the acid groups of the resin having acid groups, to bond the compound having unsaturated bond and hydroxy group in the molecule and the resin into which hydroxy group has been introduced by polyvalent isocyanate, to make ester of epoxy resin and unsaturated fatty acid, to add the compound having unsaturated bond and hydroxy group in the molecule to carboxylic acid anhydride group introduced into the resin skeleton, etc.

The positive type composition may include a composition containing o-nitrocarbinol ester compound (e.g. U.S. Pat. No. 4,632,900), a combination of polymers having branched groups which are unstable against acid and a compound which generates acid under irradiation of light (e.g. Japanese Kokai Publication Hei 4(1992)-258,957), a composition containing quinonediazide type compounds (U.S. Pat. No. 5,055,374), etc. Among them, the system which combines the quinonediazide compound as photosensitizer and resins having acid or basic groups is preferred. To be more concrete, the resins having acid and basic groups may has quinonediazide groups as photosensitive group. The introduction of the quinonediazide groups may be conducted by reacting an acid chloride of a compound having a quinonediazide unit with a resin having phenolic hydroxyl groups or amino groups. Typical examples of the resins to which the quinonediazide groups are introduced are modified novolac resin, acrylic resin, polyester, epoxy or diene resin, maleic modified resin, modified alkyd resin and the like. The quinonediazide composition may also be obtained by mixing known quinonediazide compounds with a resin composition having acid groups. The quinonediazide compounds are not specifically limited.

Usually, a copper film laminated board or copper plated board for printed circuit board is dipped in an electrocoating bath containing the electrodepositable photosensitive resin composition and subsequently the board is electrified for preset duration of time while controlling voltage or current to obtain a deposited film of the photosensitive resin. Thereafter the board is dipped in a water tank containing ultrafiltration permeation of main electrodeposition tank and further dipped in a water washing tank filled with ion exchange water. Generally speaking, for the sake of water rinsing efficiency, each water rinsing tank has two or more stages. Thereafter, it is preferred to dipcoat or spray-coat the aqueous solution containing the aforesaid surfactant on the deposited film. Other coating methods known for use may be employed, including roller coating, curtain coating and spin coating, etc. but when the continuous production at electrodeposition line is taken into account, dip-coating method or spray-coating method is preferred. Above all, dip-coating method is most preferred. As far as the liquid is uniformly coated on the deposited film, there is no restriction to the duration of time of spray or dip coating. Thereafter, it is preferred to heat-dry the film within the range of conditions where thermal degeneration of the photosensitive resin film does not occur. In general heat-drying is conducted in the range of 40° to 150° C. for 2 to 30 minutes.

Thus prepared treated film is removed by development except the part corresponding to the conductor circuit which is made by exposure to the light irradiated through the negative or positive pattern film, thus obtaining the resist pattern.

The light source to be used in the present invention may have a wavelength of mainly 300 to 450 nm, including a high pressure mercury lamp, a ultra high pressure mercury lamp, a metal-halide lamp, a xenon lamp, an arc lamp and the like.

Developing treatment may be executed by the conventional well-known method using the solution suitable for the respective photosensitive resin composition. To be more specific, in the case of the anion type composition, the solution may be in general aqueous solution of inorganic alkali such as sodium carbonate, sodium metasilicate, trisodium phosphate, sodium hydroxide, potassium hydroxide, etc.; aqueous solution of organic amines such as monoethylamine, diethylamine, triethylamine, n-propylamine, di-n-propylamine, pyrrole, piperidine, piperazine, mono-methyl ethanolamine, dimethylethanolamine, triethanolamine, diethylhydroxylamine, etc.; aqueous solution of quaternary ammonium salt, such as tetramethylammonium hydroxide, tetraethylammonium hydroxide, etc.; or aqueous ammonia. In the case of cationic composition, the solution may be aqueous solution of organic acid such as acetic acid, formic acid, lactic acid, citric acid, propionic acid, etc. These aqueous solutions may contain an appropriate amount of water-soluble organic solvent, defoaming agent and the like.

The copper surface exposed by development is then etched by aqueous solution of ferric chloride, cuprous chloride, etc.

The surface treatment of electrodeposition type photosensitive resin composition according to the present invention enables to produce a uniform deposited film of photosensitive resin composition on the substrate, effectively prevent shorting of wiring or wire breaking trouble by pinhole, etc. and it is extremely effective in the improvement of product yield in the manufacture of printed circuit board which has become increasingly fine and high in integration recently. Practical application of the surface treatment method of the present invention does not require major alteration of the existing production system and it is extremely useful industrially.

EXAMPLES

The present invention is further illustrated by the following Examples which, however, are not to be construed as limiting the present invention to their details.

Example

Photo ED P-2000 (tradename, Nippon Paint, Co., Lt.) which is an electrodeposition type photosensitive resin composition was dissolved in an electrodeposition tank and the temperature was adjusted to 25° C. A copper-plated board with plating thickness of 43μ was dipped in the bath and using it as anode, it was electrified with a current density of 50 mA/dm$^2$ for 120 sec. and a positive type photosensitive resin film of 6μ in thickness was obtained. Subsequently the substrate was dipped in a ultrafiltration permeation tank of the electrodeposition tank for 40 sec. and subsequently in the ion exchange water tank for 40 sec. and then rinsed with water.

Furthermore, the substrate was dipped for 40 sec. in the aqueous solution of the following four different surfactant solutions having a solid concentration of 0.5% and then dried by cold wind:

(a) Sodium dodecylbenzenesulfonate which is solid at normal temperature and has no film-forming property, (b) a polymeric surfactant Demol EP (tradename, manufactured by Kao Co., Ltd.) which is solid at normal temperature and has film-forming property, (c) Prosoft KL-30T (triethanolamine salt type, available from Kyoeisha Yushi Kagaku Kogyo K.K.) which is hydrolyzed collagen acylated with palm oil fatty acid, and (d) Prosoft KL-30K (potassium salt type, available from Kyoeisha Yushi Kagaku Kogyo K.K.) which is hydrolyzed collagen acylated with palm oil fatty acid.

Subsequently, one drop of various kinds of water indicated in Table 1 was dropped on the treated substrate by a dropper and it was dried for 7 minutes at 100° C. Thereafter, the entire surface of the substrate including the part wetted by water drop was exposed to 350 mj/cm$^2$ through a positive type test pattern film. Subsequently it was developed by 1% aqueous solution of sodium carbonate at 30° C. for 70 sec. and further it was etched by 40° C. ferric chloride solution. Table 1 shows the results of the above operation. As for all treated substrates, development was possible in 45 sec. and maximum remaining steps by 21 step Stouffer Step was 5 steps after etching, indicating no difference from the untreated boards stated later in respect of either developing property or sensitivity.

Comparative Example

Using Photo ED P-2000, electrodeposition coating was conducted to obtain 43μ copper-plated board and water drop formation, light exposure, developing and etching were conducted in the same manner as in Example 1, except that only the treatment by aqueous solution containing surfactant was eliminated. The results are shown in Table 1. Development was possible in minimum 45 sec. and the maximum remaining steps of 21 steps Stopper Step was 5 steps after etching.

TABLE 1

| Treating solution | Drop of electrodeposition bath | | Drop of ultrafiltration permeation of electrodeposition bath | | City water | Ion exchanged water |
| --- | --- | --- | --- | --- | --- | --- |
| | 1/20 dilution | 1/100 dilution | Neat | 1/5 dilution | | |
| Comparative Ex. 1 | Poor | Poor | Poor | Poor | Poor | Poor |

TABLE 1-continued

| Treating solution | Drop of electrodeposition bath | | Drop of ultrafiltration permeation of electrodeposition bath | | City water | Ion exchanged water |
|---|---|---|---|---|---|---|
| | 1/20 dilution | 1/100 dilution | Neat | 1/5 dilution | | |
| | Poor | Poor | Poor | Poor | Poor | Poor |
| Sodium | Not bad | Not bad | Not bad | Not bad | Not bad | Not bad |
| dodecylbenzene sulfonate | Not bad | Not bad | Not bad | Not bad | Not bad | Not bad |
| Demor EP | Not bad | Not bad | Not bad | Not bad | Not bad | Not bad |
| | Not bad | Not bad | Not bad | Not bad | Not bad | Not bad |
| Prosoft KL-30T | Not bad | Good | Not bad | Good | Good | Good |
| | Good | Good | Good | Good | Good | Good |
| Prosoft KL-30K | Not bad | Good | Not bad | Good | Good | Good |
| | Good | Good | Good | Good | Good | Good |

Upper evaluation in column: Condition just after dropping.
Lower evaluation in column: Etching condition of the water drop portions.

Evaluation:
Condition just after dropping
Good: Water drops spread over and no drop marks remain.
Not bad: Water drops spread over, but drop marks slightly remain after drying.
Poor: Spherical water drops form and many drop marks remain.
Etching condition of drop portions
Good: Etching is possible throughout.
Not bad: Etching is partially possible.
Poor: Etching is impossible.
What is claimed is:

1. A process for surface treating an electrodeposited photosensitive resin film to reduce water spotting, comprising electrodepositing a photosensitive resin composition on a copper plate for a printed circuit board to form a resist layer, applying an aqueous solution containing an organic or inorganic alkali salt of an acylated polypeptide as a surfactant in an amount of 0.005 to 50 wt % on the electrodeposited film, and then drying, said acylated polypeptide being solid at ambient room temperature.

2. The process according to claim 1 wherein said photosensitive resin composition is a positive resin.

* * * * *